(12) United States Patent
Kim et al.

(10) Patent No.: US 9,361,969 B2
(45) Date of Patent: Jun. 7, 2016

(54) SEMICONDUCTOR DEVICE AND METHOD FOR DRIVING THE SAME

(71) Applicant: SK hynix Inc., Gyeonggi-do (KR)

(72) Inventors: Yong-Ju Kim, Gyeonggi-do (KR);
Dae-Han Kwon, Gyeonggi-do (KR);
Hae-Rang Choi, Gyeonggi-do (KR);
Jae-Min Jang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 36 days.

(21) Appl. No.: 14/278,031

(22) Filed: May 15, 2014

(65) Prior Publication Data

US 2015/0124545 A1 May 7, 2015

(30) Foreign Application Priority Data

Nov. 4, 2013 (KR) ........................ 10-2013-0132974

(51) Int. Cl.
*G11C 7/04* (2006.01)
*G11C 11/406* (2006.01)

(52) U.S. Cl.
CPC ................................ *G11C 11/40626* (2013.01)

(58) Field of Classification Search
CPC .................................................. G11C 11/40626
USPC .............................. 365/211, 222, 193, 189.09
See application file for complete search history.

(56) References Cited

U.S. PATENT DOCUMENTS

| | | | | | |
|---|---|---|---|---|---|
| 6,756,856 | B2 * | 6/2004 | Song | .......................... | G11C 7/04 331/176 |
| 6,967,521 | B2 * | 11/2005 | Lee | .......................... | G01K 3/10 327/262 |
| 6,970,393 | B1 * | 11/2005 | Cho | ...................... | G11C 11/406 365/194 |
| 6,972,585 | B2 * | 12/2005 | Ito | ........................ | G11C 11/406 324/750.3 |
| 7,038,968 | B2 * | 5/2006 | Kim | .......................... | G11C 7/04 365/211 |
| 7,107,178 | B2 * | 9/2006 | Won | ........................ | G01K 3/005 327/513 |
| 7,184,349 | B2 * | 2/2007 | Sako | ...................... | G11C 11/406 365/212 |
| 7,190,628 | B2 * | 3/2007 | Choi | ...................... | G11C 11/406 365/211 |
| 7,292,488 | B2 * | 11/2007 | Hokenmaier | ............ | G11C 7/04 331/176 |
| 7,471,583 | B2 * | 12/2008 | Kim | .......................... | G11C 7/04 365/189.07 |
| 7,492,657 | B2 * | 2/2009 | Sako | ........................ | G11C 7/04 365/189.09 |
| 7,583,553 | B2 * | 9/2009 | Mori | ........................ | G11C 7/04 365/212 |
| 7,594,750 | B2 * | 9/2009 | Lee | .......................... | G01K 7/42 327/513 |
| 7,705,688 | B2 * | 4/2010 | Hong | ........................ | G06F 1/04 331/176 |
| 7,813,205 | B2 * | 10/2010 | Sako | ...................... | G11C 11/406 365/211 |
| 7,859,931 | B2 * | 12/2010 | Hong | ........................ | G01K 7/00 331/176 |
| 7,936,616 | B2 * | 5/2011 | Jeong | ...................... | G01K 3/005 365/189.07 |
| 7,965,571 | B2 * | 6/2011 | Jeong | ...................... | G01K 7/015 365/211 |
| 8,169,846 | B2 * | 5/2012 | Chung | ...................... | G11C 7/04 365/185.25 |
| 8,547,759 | B2 * | 10/2013 | Kadowaki | ............ | G11C 11/406 365/189.05 |

FOREIGN PATENT DOCUMENTS

KR  1020040048750  6/2004
KR  1020110130154  12/2011

* cited by examiner

*Primary Examiner* — Viet Q Nguyen
(74) *Attorney, Agent, or Firm* — IP & T Group LLP

(57) ABSTRACT

A semiconductor device includes a periodic signal generating circuit for generating a periodic signal having a set period regardless of changes in temperature in response to a first trimming signal as a default value and controlling the set period of the periodic signal based on the temperature in response to a second trimming signal, and an internal circuit to perform a set operation in response to the periodic signal.

15 Claims, 3 Drawing Sheets

SEMICONDUCTOR DEVICE AND METHOD FOR DRIVING THE SAME

CROSS-REFERENCE TO RELATED APPLICATIONS

The present application claims priority of Korean Patent Application No. 10-2013-0132974, filed on Nov. 4, 2013, which is incorporated herein by reference in its entirety.

BACKGROUND

1. Field

Exemplary embodiments of the present invention relate to a semiconductor design technology, and more particularly, to a semiconductor device capable of generating and using a periodic signal and a method for driving a semiconductor device.

2. Description of the Related Art

Generally, in volatile memory devices such as a Dynamic Random Access Memory (DRAM) device, electric charges stored in a memory cell may gradually decrease and data stored in the memory cell may change from its initial value as time passes. This requires an operation of sensing and charging memory cells of a volatile memory at predetermined periods, a process called a refresh operation.

The refresh operation may be carried out as follows. Word lines connected to memory cells are sequentially selected at predetermined times, then electric charges which are stored in the memory cells coupled with the selected word line are amplified by a bit line sense amplifier. The amplified electric charges are stored in the memory cells again. Accordingly, a volatile memory device safely retains data stored in the memory cells without loss through this refresh operation.

Volatile memory devices include a refresh signal generating circuit, which generates a refresh signal at predetermined periods as part of the refresh operation. Since the refresh signal generating circuit is formed of elements which have performance characteristics that deteriorate with changes in temperature, such as a transistor, the refresh signal generating circuit is sensitive to temperature changes as well. For example, transistors in the refresh signal generating circuit may conduct dramatically less current at a low temperatures (e.g., 30° C. or lower) and dramatically higher current at high temperatures (e.g., 80° C. or higher).

SUMMARY

Exemplary embodiments of the present invention are directed to a semiconductor device for controlling or uniformly maintaining the period of a refresh signal based on changes in temperature, and a method for driving the semiconductor device.

In accordance with an embodiment of the present invention, a semiconductor device includes a periodic signal generating circuit suitable for generating a periodic signal with a set period regardless of changes in temperature in response to a first trimming signal as a default value and controlling the set period of the periodic signal based on the temperature in response to a second trimming signal, and an internal circuit suitable for performing a set operation in response to the periodic signal.

Herein, the periodic signal generating circuit may control the set period of the periodic signal based on the temperature when the temperature is within a set temperature range. The set operation may include a refresh operation. The semiconductor device may further include a first trimming circuit suitable for generating the first trimming signal corresponding to the set period of the periodic signal during a probe test; and a third trimming circuit suitable for generating the third trimming signal corresponding to temperature.

In accordance with another embodiment of the present invention, a semiconductor device includes a constant current supply block suitable for supplying a first current to a charging/discharging node in response to a first trimming signal, wherein the first current remains constant regardless of changes in temperature, a variable current supply block suitable for supplying a second current controlled based on temperature to the charging/discharging node in response to a second trimming signal, a reference voltage generating block suitable for generating a reference voltage in response to a third trimming signal, a periodic signal generating block suitable for generating a periodic signal based on a charging/discharging voltage of the charging/discharging node in comparison with a reference voltage, and an internal circuit suitable for performing a set operation in response to the periodic signal.

The constant current supply block may include a plurality of first switching units coupled in parallel with the charging/discharging node and selectively switched in response to the first trimming signal; and a plurality of current sources coupled between the respective first switching units and a high voltage terminal and suitable for supplying the first current to the charging/discharging node. The variable current supply may include a plurality of second switching units coupled in parallel with the charging/discharging node and selectively switched in response to the third trimming signal; and a plurality of charging units coupled between the respective second switching units and a high voltage terminal and suitable for supplying the second current to the charging/discharging node. The periodic signal generating block may include a first comparison unit suitable for comparing the charging/discharging voltage with the reference voltage; a discharging unit coupled between the charging/discharging node and a low voltage terminal and switched in response to a first comparison signal that is outputted from the first comparison unit; and a periodic signal output unit suitable for outputting the charging/discharging voltage as the periodic signal. The periodic signal output unit may include a division unit. The semiconductor device may further include a first trimming circuit programmed to generate the first trimming signal corresponding to the first current during a probe test; a second trimming circuit programmed to generate the second trimming signal to set up the reference voltage during the probe test; and a third trimming circuit suitable for generating the third trimming signal corresponding to the temperature. The third trimming circuit may include a temperature sensing block suitable for detecting the temperature; and a third trimming signal generating block suitable for generating the third trimming signal corresponding to a temperature detection voltage outputted from the temperature sensing block. The third trimming signal generating block may include a detection reference voltage generating unit suitable for generating a temperature detection reference voltage in response to a temperature detection code which is changed at each of detection processes; a second comparison unit suitable for comparing the temperature detection voltage with the temperature detection reference voltage at each of the detection processes; a temperature detection unit suitable for detecting temperature through the detection processes in response to a second comparison signal outputted from the second comparison unit; a feedback unit suitable for feeding back a detection result code outputted from the temperature detection unit as the temperature detection code; and a third trimming signal output unit suitable for outputting the detection result code as the third trimming signal. The detection reference voltage generating unit may include a Digital-to-Analog Converter (DAC). The temperature detection unit may include a detection control unit suitable for generating a first control signal, a second control signal and a clock through the detection processes; and a detection performing unit suitable for generating the detection result code in response to the second control signal, the clock and the second comparison signal, and wherein the second comparison unit operates in response to the first control signal. The detection control unit may include a Finite State Machine (FSM) suitable for generating the first control signal and the second control signal through the detection processes; and a clock generator suitable for generating the clock through the detection processes. The detection performing unit includes a Successive Approximation Register (SAR). The feedback unit may include an offset control unit suitable for controlling an offset of the detection result code; and a code conversion unit suitable for generating the temperature detection code in response to an offset control code outputted from the offset control unit and the detection result code. The offset control unit may include a fuse circuit, and the code conversion unit includes a binary-to-thermometer converter (BTC). The third trimming signal output unit outputs one between the detection result code and a test code as the third trimming signal in response to a test mode signal. The third trimming circuit may include a fuse circuit. The set operation may include a refresh operation.

In accordance with a further embodiment of the present invention, a method for driving the semiconductor device includes setting a refresh signal period at a first temperature within a first temperature range, generating the refresh signal by uniformly maintaining a set period of the refresh signal at a temperature within the first temperature range and controlling the set period of the refresh signal at a temperature within a second temperature range other than first temperature range, based on the temperature, and performing a refresh operation in response to the refresh signal.

The first temperature range may include a temperature range of equal to or lower than 30° C. and a temperature range of equal to or higher than 80° C., and the second temperature range includes a temperature range of over 30° C. to lower than 80° C. The controlling of the set period of the refresh signal based on the temperature may include detecting the temperature to produce a temperature detection result; and controlling the period of the refresh signal based on the temperature detection result. A Successive Approximation Register (SAR) is used to detect the temperature.

DETAILED DESCRIPTION

Hereafter, exemplary embodiments of the present invention will be described below in more detail with reference to the accompanying drawings. Rather, these embodiments are provided so that this disclosure will be thorough and complete, and will fully convey the scope of the present invention to those skilled in the art.

In the following embodiments of the present invention, a semiconductor device such as a Dynamic Random Access Memory (DRAM) device will be used as an example for the simple description.

Figure 1:
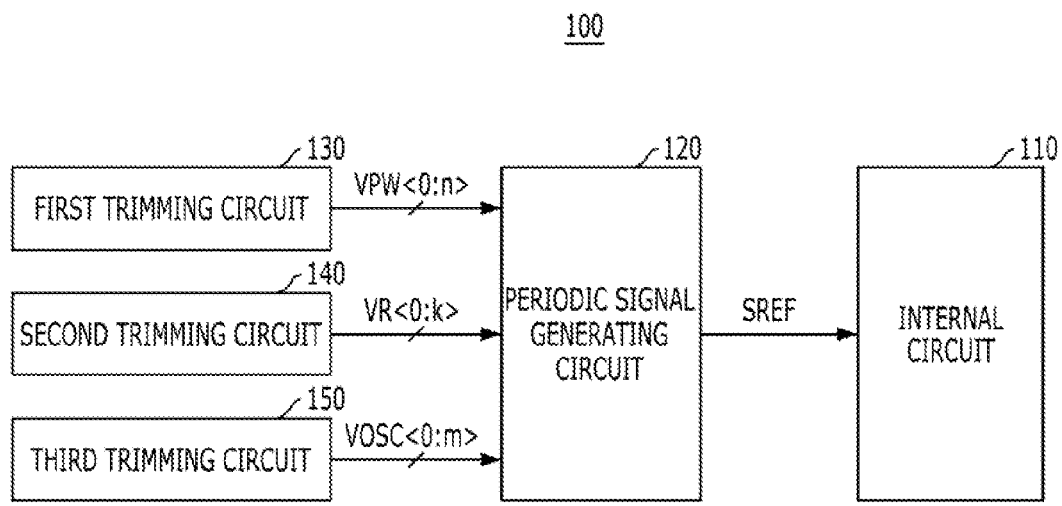
FIG. 1 is a block diagram illustrating a semiconductor device in accordance with an embodiment of the present invention.

FIG. 1 is a block diagram illustrating a semiconductor device in accordance with an embodiment of the present invention.

Referring to FIG. 1, a semiconductor device 100 may include an internal circuit 110, a periodic signal generating circuit 120, and first to third trimming circuits 130 to 150. The internal circuit 110 performs a refresh operation in response to a refresh signal SREF. The periodic signal generating circuit 120 generates the refresh signal SREF having a predetermined period regardless of changes in temperature in response to a first trimming signal VPW<0:n> and a second trimming signal VR<0:k> as a default value. The period of the refresh signal SREF is controlled based on the change of temperature in response to a third trimming signal VOSC<0:m>. The first trimming circuit 130 generates the first trimming signal VPW<0:n> in order to set up the unit period of the refresh signal SREF. The second trimming circuit 140 generates the second trimming signal VR<0:k> in order to set up a reference voltage VREF which will be described below. The third trimming circuit 150 generates the third trimming signal VOSC<0:m> corresponding to the change of temperature.

Herein, the internal circuit 110 may include a refresh control block (not shown) for controlling a refresh operation in response to the refresh signal SREF and a memory cell region (not shown) where the refresh operation is performed under the control of the refresh control block. During the refresh operation, word lines coupled with memory cells are sequentially selected at every predetermined time. Then, electric charges stored in the memory cells corresponding to the selected word line are amplified by a bit line sense amplifier. The amplified electric charges are stored in the memory cells again. Accordingly, the semiconductor device 100 safely retains the data stored in the memory cells through the refresh operation.

The periodic signal generating circuit 120 uniformly maintains the period of the refresh signal SREF when the temperature is within a first temperature range, and controls the period of the refresh signal SREF based on the change of temperature when the temperature is within a second temperature range that is out of the first temperature range, in response to the first trimming signal VPW<0:n> to the third trimming signal VOSC<0:m>.

Figure 2:
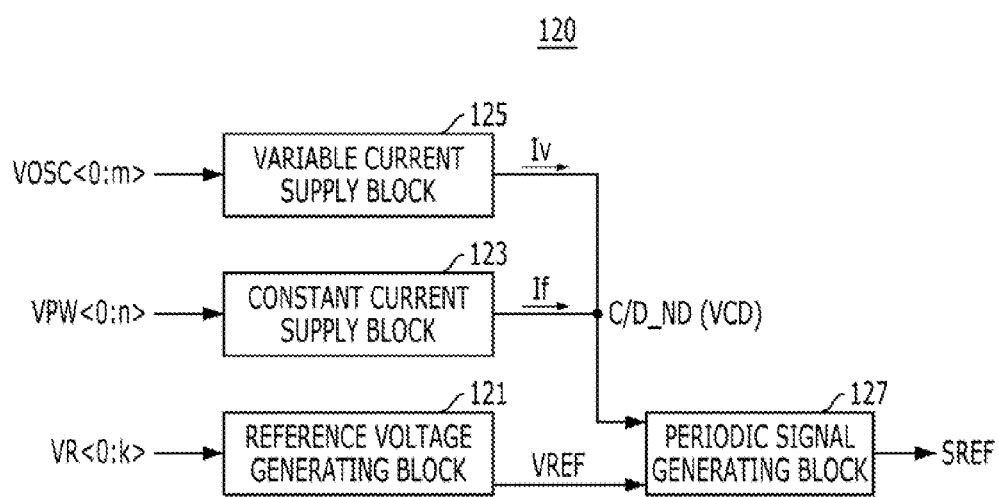
FIG. 2 is a block diagram illustrating an example of a periodic signal generating circuit shown in FIG. 1.

FIG. 2 is a block diagram illustrating an example of the periodic signal generating circuit 120 shown in FIG. 1.

Referring to FIG. 2, the periodic signal generating circuit 120 may include a reference voltage generating block 121, a constant current supply block 123, a variable current supply block 125, and a periodic signal generating block 127. The reference voltage generating block 121 generates the reference voltage VREF in response to the second trimming signal VR<0:k>. The constant current supply block 123 supplies a constant current If to a charging/discharging node C/D_ND regardless of the change of temperature in response to the first trimming signal VPW<0:n>. The variable current supply block 125 supplies a variable current Iv controlled based on the change of temperature in response to the third trimming signal VOSC<0:m> to the charging/discharging node C/D_ND. The periodic signal generating block 127 generates a refresh signal SREF based on a charging/discharging voltage VCD which is applied to the charging/discharging node C/D_ND in comparison with the reference voltage VREF.

Herein, the reference voltage generating block 121 may include a Digital-to-Analog Converter (DAC).

Figure 3:
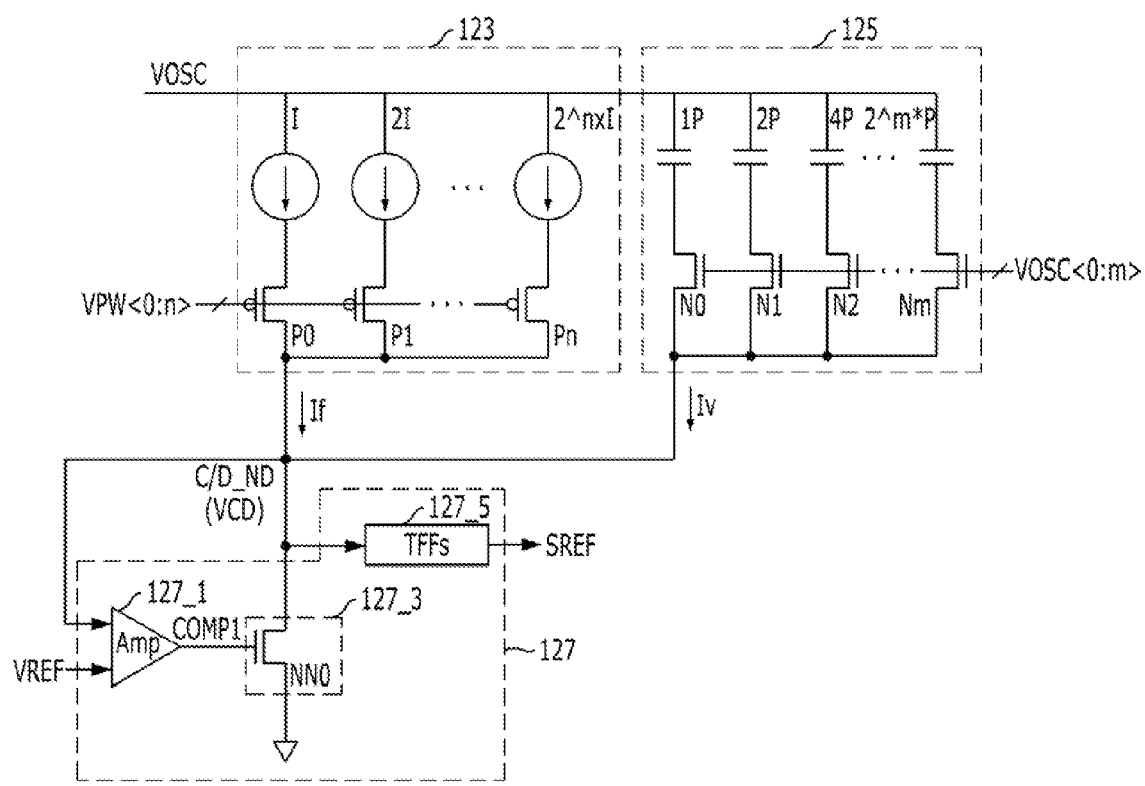
FIG. 3 is a block diagram illustrating an example of a constant current supply block, a variable current supply block, and a periodic signal generating block shown in FIG. 2.

FIG. 3 is a block diagram illustrating in detail the constant current supply block 123, the variable current supply block 125, and the periodic signal generating block 127 shown in FIG. 2.

Referring to FIG. 3, the constant current supply block 123 may include a plurality of first switching units P0 to Pn which are coupled in parallel with a charging/discharging node C/D_ND and selectively switched in response to a first trimming signal VPW<0:n>, and a plurality of current sources I to $2^n*I$ which are coupled between the first switching units P0 to Pn and a high voltage (VOSC) terminal and supply a constant current If to the charging/discharging node C/D_ND. Each of the first switching units P0 to Pn may include a PMOS transistor, and each of the current sources may include an ideal current source. The constant current supply block 123 may generate the uniform fixed current If by compensating for a bias based on the change of temperature.

The variable current supply block 125 may include a plurality of second switching units N0 to Nm which are coupled in parallel with a charging/discharging node C/D_ND and selectively switched in response to a third trimming signal VOSC<0:m>, and a plurality of charging units 1P to $2^m*P$ which are coupled between the second switching units N0 to Nm and the high voltage (VOSC) terminal and supply a variable current Iv to the charging/discharging node C/D_ND. Each of the second switching units N0 to Nm may include a NMOS transistor, and each of the charging units 1P to $2^m*P$ may include a capacitor. The variable current supply block 125 may generate the variable current Iv controlled based on the change of temperature by controlling its capacitance based on the change of temperature.

The periodic signal generating block 127 may include a first comparison unit 127, a discharging unit 127_3, and a division unit 127_5. The first comparison unit 127_1 compares a reference voltage VREF and a charging/discharging voltage VCD with each other. The discharging unit 127_3 is coupled between the charging/discharging node C/D_ND and a low voltage (VSS) terminal and switched in response to a first comparison signal COMP1 that is outputted from the first comparison unit 127_1. The division unit 127_5 outputs the charging/discharging voltage VCD as a refresh signal SREF. The charging/discharging voltage VCD has a triangular waveform depending on a charging/discharging operation and generates the refresh signal SREF having a square waveform as it passes through the division unit 127_5.

Referring back to FIG. 1, the first trimming circuit 130 and the second trimming circuit 140 may include a fuse circuit for generating the first trimming signal VPW<0:n> and the second trimming signal VR<0:k> based on a fuse program or a fuse cutting process. The first and second trimming circuits 130 and 140 go through the fuse program or the fuse cutting process so that the periodic signal generating circuit 120 generates a refresh signal SREF having a unit period (e.g., 1 μm) at a certain temperature (e.g., 80° C.) during the probe test. The first and second trimming circuits 130 and 140 generate the first trimming signal VPW<0:n> and the second trimming signal VR<0:k> based on the fuse program or the fuse cutting process.

Figure 4:
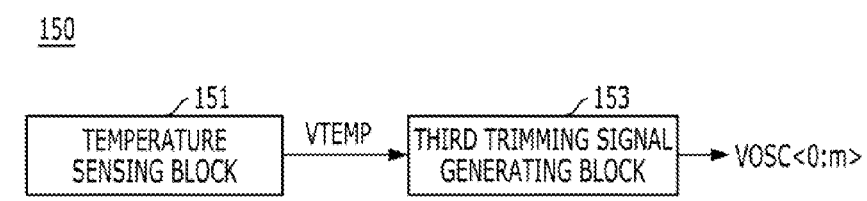
FIG. 4 is a block diagram illustrating a third trimming circuit shown in FIG. 1.
Figure 5:
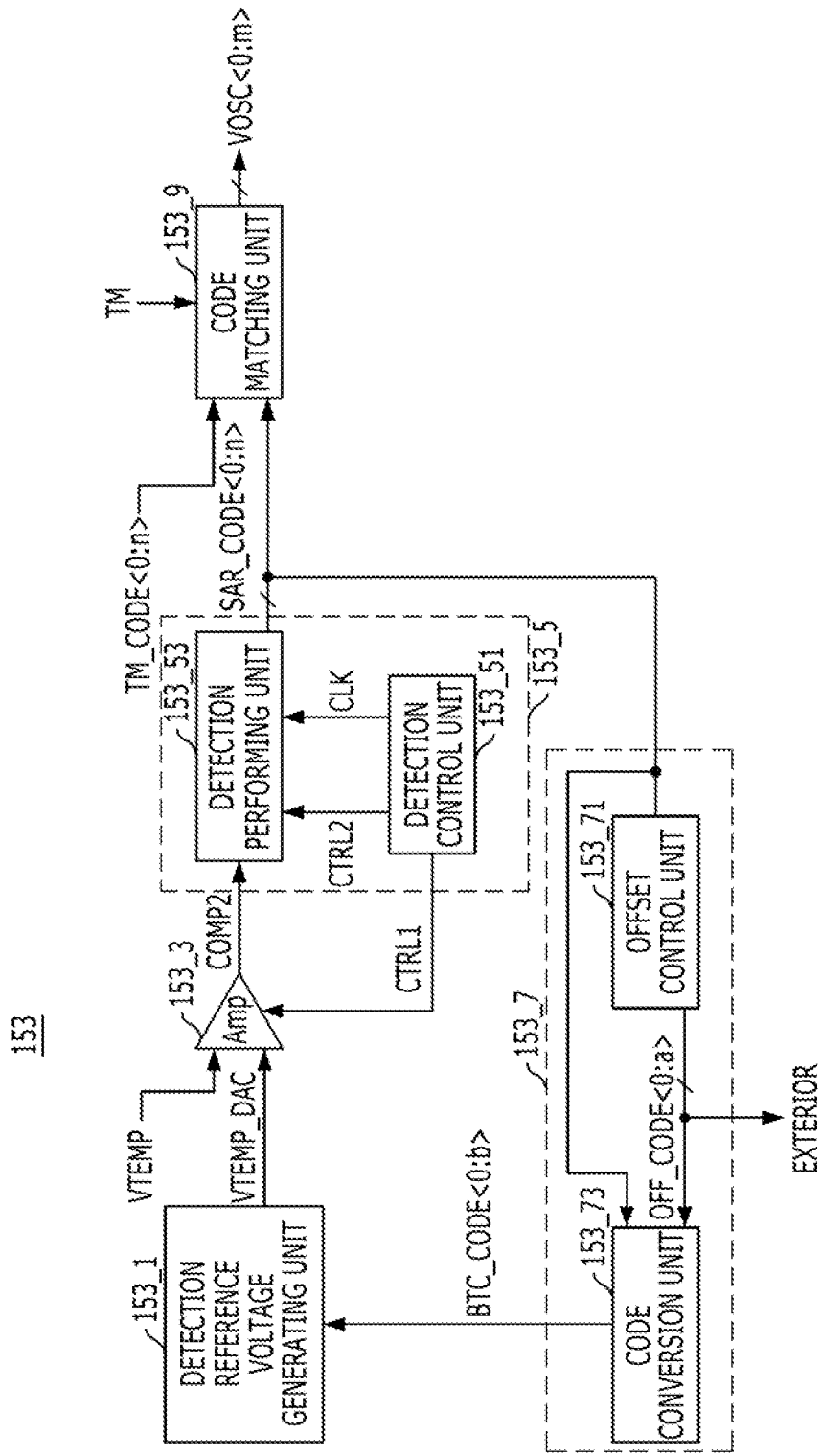
FIG. 5 is a block diagram illustrating a third trimming signal generating block shown in FIG. 4.

FIG. 4 is a block diagram illustrating a third trimming circuit 150 shown in FIG. 1. FIG. 5 is a block diagram illustrating a third trimming signal generating block 153 shown in FIG. 4.

Referring to FIG. 4, the third trimming circuit 150 may include a temperature sensing block 151 for detecting a temperature and a third trimming signal generating block 153 for generating a third trimming signal VOSC<0:m> corresponding to a temperature detection voltage VTEMP outputted from the temperature sensing block 151.

Herein, the temperature sensing block 151 outputs the temperature detection voltage VTEMP corresponding to the detected temperature. Detailed description on the temperature sensing block 151 is omitted because it is widely known to those skilled in the art.

The third trimming signal generating block 153 detects a temperature through a plurality of detection processes and generates the third trimming signal VOSC<0:m> corresponding to the detected temperature. Referring to FIG. 5, the third trimming signal generating block 153 may include a detection reference voltage generating unit 153_1, a second comparison unit 153_3, a temperature detection unit 153_5, a feedback unit 153_7, and a code matching unit 153_9. The detection reference voltage generating unit 153_1 generates a detection reference voltage VTEMP_DAC in response to a temperature detection code BTC_CODE<0:b> which is changed at each detection process. The second comparison unit 153_3 compares the temperature detection voltage VTEMP with the detection reference voltage VTEMP_DAC. The temperature detection unit 153_5 detects a temperature through a plurality of temperature detection processes in response to a second comparison signal COMP2 outputted from the second comparison unit 153_3. The feedback unit 153_7 feeds back a detection result code SAR_CODE<0:m> outputted from the temperature detection unit 153_5 as the temperature detection code BTC_CODE<0:b>. The code matching unit 153_9 outputs a test code TM_CODE<0:m> or the detection result code SAR_CODE<0:m> as the third trimming signal VOSC<0:m> in response to a test mode signal TM.

The detection reference voltage generating unit 153_1 may include a Digital-to-Analog Converter (DAC).

The second comparison unit 153_3 may include a differential amplifier.

The temperature detection unit 153_5 may include a detection control unit 153_51 for generating a first control signal CTRL1, a second control signal CTRL2 and a clock CLK through the detection processes, and a detection performing unit 153_53 for generating the detection result code SAR_CODE<0:m> in response to the second control signal CTRL2, the clock CLK and the second comparison signal COMP2. For example, the detection control unit 153_51 may include a Finite State Machine (FSM) for generating the first control signal CTRL1 and the second control signal CTRL2 through the detection processes, and a clock generator for generating the clock CLK through the detection processes. The detection performing unit 153_53 may include a Successive Approximation Register (SAR) to detect a temperature. When the temperature detection unit 153_5 is formed as above, the second comparison unit 153_3 may operate in response to the first control signal CTRL1.

The feedback unit 153_7 may include an offset control unit 153_71 for controlling an offset of the detection result code SAR_CODE<0:m>, and a code conversion unit 153_73 for generating the temperature detection code BTC_CODE<0:b> in response to an offset control code OFF_CODE<0:a> outputted from the offset control unit 153_71 and the detection result code SAR_CODE<0:m>. For example, the offset control unit 153_71 may include a fuse circuit, and the code conversion unit 153_73 may include a binary-to-thermometer converter (BTC).

The code matching unit 153_9 outputs the detection result code SAR_CODE<0:m> as the third trimming signal VOSC<0:m> when the test mode signal TM is deactivated. The code matching unit 153_9 outputs the test code TM_CODE<0:m> inputted from an exterior as the third trimming signal VOSC<0:m> when the test mode signal TM is activated.

Hereafter, a method for driving a semiconductor device 100 in accordance with an embodiment of the present invention is described.

In accordance with an exemplary embodiment of the present invention, the method for driving the semiconductor device 100 may include a first step of generating a refresh signal SREF having a predetermined period at a certain temperature within a first temperature range, a second step of uniformly maintaining the period of the refresh signal SREF when a temperature is within the first temperature range and controlling the period of the refresh signal SREF based on the temperature when the temperature is within a second temperature range that is out of the first temperature range, and a third step of performing a refresh operation in response to the refresh signal SREF.

The first step may be performed during a probe test. For example, during the probe test, a constant current If is trimmed by a test device (not shown) to generate a refresh signal SREF having a period of 1 μm at 80° C., and a first trimming signal VPW<0:n> of a first trimming circuit 130 is defined through a fuse program or a fuse cutting process based on the trimming result. At this time, a constant current supply block 123, which supplies the constant current If in response to the first trimming signal VPW<0:n>, constantly supplies the constant current If through a plurality of current sources I to 2^n*I. Further, in the first step, a period of the refresh signal SREF may be set up by using a second trimming circuit 140 along with the first trimming circuit 130. For example, during the probe test, a reference voltage VREF may be trimmed by a test device (not shown in the drawing) to generate a refresh signal SREF having a period of 1 μm at 80° C., and a second trimming signal VR<0:k> of the second trimming circuit 140 may be defined through a fuse program or a fuse cutting process based on the trimming result. Therefore, in the first step, the unit period of the refresh signal SREF is set up delicately and precisely by using the first trimming circuit 130 and the second trimming circuit 140.

The second step may be performed in condition that the unit period (e.g., 1 μm at 80° C.) of the refresh signal SREF is decided in the first step. For example, the semiconductor device 100 maintains the period of the refresh signal SREF at 1 μm when a current temperature is within a first temperature range of 80° C. or higher, controls the period of the refresh signal SREF from over 1 μm to less than 36 μm based on the change of temperature when a current temperature is within a second temperature range of over 30° C. to lower than 80° C., or maintains the period of the refresh signal SREF at 36 μm when the current temperature is within a first temperature range of 30° C. or higher. Particularly, a third trimming circuit 150 operates when a current temperature is within the second temperature range. The third trimming circuit 150 detects a current temperature every uniform period, and changes a code value of a third trimming signal VOSC<0:m> based on the current temperature when the detected temperature is within the second temperature range (e.g., from over 30° C. to lower than 80° C.). At this time, the third trimming circuit 150 may detect the current temperature, and define the code value of the third trimming signal VOSC<0:m> based on the detection result. A Successive Approximation Register (SAR) may be used for detecting temperature.

Since the third trimming signal VOSC<0:m> is affected by the conditions such as a process, voltage and the like, an offset of the third trimming signal VOSC<0:m> is required to be controlled in order to set one of the least significant bit (LSB) value and the most significant bit (MSB) value corresponding to the second temperature range (e.g., from over 30° C. to lower than 80° C.). For example, when a desired code value of the third trimming signal VOSC<0:m> is not generated at a certain temperature (e.g., 80° C.), the offset of the third trimming signal VOSC<0:m> may be compensated for by controlling the least significant bit (LSB) value through a trimming process of an offset control unit 153_71. The offset of the third trimming signal VOSC<0:m> may be compensated for through another test mode and in the first or second step as well.

In the third step, an Internal circuit 110 including a plurality of memory cells may perform a refresh operation in response to the refresh signal SREF. Since electric charges stored in each memory cell, due to the characteristics of electric charges, decrease rapidly at a high temperature and decrease slowly at a low temperature, the refresh operation is better to be performed frequently at high temperatures and less frequently at low temperatures. This may be determined based on the period of the refresh signal SREF. At this time, the period of the refresh signal SREF may be controlled in consideration of the characteristics of a transistor in response to changes in temperature. In other words, the Internal circuit 100 performs the refresh operation at a uniform period in response to the refresh signal SREF having a uniform period when a current temperature is within a first temperature range (e.g., equal to or lower than 30° C., or equal to or higher than 80° C.) where the transistor's characteristics are deteriorated. The internal circuit 100 performs the refresh operation at a period which is linearly controlled based on a temperature change in response to the refresh signal SREF which has a high frequency at a high temperature and a low frequency at a low temperature when a current temperature is within a second temperature range (e.g., from over 30° C. to lower than 80° C.).

According to the embodiment of the present invention described above, the semiconductor device has the advantage of improving the performance of the refresh operation by uniformly maintaining the period of the refresh signal or linearly controlling the period of the refresh signal based on temperature.

Stability and reliability of a refresh operation may be secured by uniformly maintaining a refresh period within the first temperature range where the transistor's current characteristics are dramatically deteriorated, and linearly controlling the refresh period based on changes in temperature within the second temperature range, which is out of the range of the first temperature, considering the current characteristics of a transistor to a change of temperature.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A semiconductor device, comprising:
   a periodic signal generating circuit suitable for generating a periodic signal, having a set period regardless of temperature changes, in response to a first trimming signal as a default value and controlling the set period of the periodic signal based on temperature in response to a second trimming signal; and an internal circuit suitable for performing a set operation in response to the periodic signal, a first trimming circuit suitable for generating the first trimming signal corresponding to the set period of the periodic signal during a probe test; and a second trimming circuit suitable for generating the second trimming signal corresponding to temperature.

2. The semiconductor device of claim 1, wherein the periodic signal generating circuit controls the set period of the periodic signal based on temperature when the temperature is within a set temperature range.

3. The semiconductor device of claim 1, wherein the set operation includes a refresh operation.

4. A semiconductor device, comprising:

a constant current supply block suitable for supplying a first current to a charging/discharging node in response to a first trimming signal, wherein the first current has a constant level regardless of temperature changes;

a variable current supply block suitable for supplying a third current controlled based on temperature to the charging/discharging node in response to a third trimming signal;

a reference voltage generating block suitable for generating a reference voltage in response to a second trimming signal;

a periodic signal generating block suitable for generating a periodic signal based on a charging/discharging voltage of the charging/discharging node in comparison with the reference voltage; and an internal circuit suitable for performing a set operation in response to the periodic signal.

5. The semiconductor device of claim 4, wherein the constant current supply block includes:

a plurality of first switching units coupled in parallel with the charging/discharging node and selectively switched in response to the first trimming signal; and a plurality of current sources coupled between the respective first switching units and a high voltage terminal and suitable for supplying the first current to the charging/discharging node.

6. The semiconductor device of claim 4, wherein the variable current supply block includes:

a plurality of second switching units coupled in parallel with the charging/discharging node and selectively switched in response to the third trimming signal; and a plurality of charging units coupled between the respective second switching units and a high voltage terminal and suitable for supplying the second current to the charging/discharging node.

7. The semiconductor device of claim 4, wherein the periodic signal generating block includes:

a first comparison unit suitable for comparing the charging/discharging voltage with the reference voltage;

a discharging unit coupled between the charging/discharging node and a low voltage terminal and switched in response to a first comparison signal that is outputted from the first comparison unit; and a periodic signal output unit suitable for outputting the charging/discharging voltage as the periodic signal.

8. The semiconductor device of claim 7, wherein the periodic signal output unit includes a division unit.

9. The semiconductor device of claim 4, further comprising:

a first trimming circuit programmed to generate the first trimming signal corresponding to the first current during a probe test;

a second trimming circuit programmed to generate the second trimming signal to set up the reference voltage during the probe test; and a third trimming circuit suitable for generating the third trimming signal corresponding to the temperature.

10. The semiconductor device of claim 9, wherein the third trimming circuit includes:

a temperature sensing block suitable for detecting the temperature; and a third trimming signal generating block suitable for generating the third trimming signal corresponding to a temperature detection voltage outputted from the temperature sensing block.

11. The semiconductor device of claim 10, wherein the third trimming signal generating block includes:

a detection reference voltage generating unit suitable for generating a temperature detection reference voltage in response to a temperature detection code which is changed at each of detection processes;

a second comparison unit suitable for comparing the temperature detection voltage with the temperature detection reference voltage at each of the detection processes;

a temperature detection unit suitable for detecting temperature through the detection processes in response to a second comparison signal outputted from the second comparison unit;

a feedback unit suitable for feeding back a detection result code outputted from the temperature detection unit as the temperature detection code; and a third trimming signal output unit suitable for outputting the detection result code as the third trimming signal.

12. The semiconductor device of claim 11, wherein the temperature detection unit includes:

a detection control unit suitable for generating a first control signal, a second control signal and a clock through the detection processes; and a detection performing unit suitable for generating the detection result code in response to the second control signal, the clock and the second comparison signal, and wherein the second comparison unit operates in response to the first control signal.

13. The semiconductor device of claim 11, wherein the feedback unit includes:

an offset control unit suitable for controlling an offset of the detection result code; and a code conversion unit suitable for generating the temperature detection code in response to an offset control code outputted from the offset control unit and the detection result code.

14. The semiconductor device of claim 11, wherein the third trimming signal output unit outputs one between the detection result code and a test code as the third trimming signal in response to a test mode signal.

15. The semiconductor device of claim 4, wherein the set operation includes a refresh operation.

* * * * *